Figure 1:
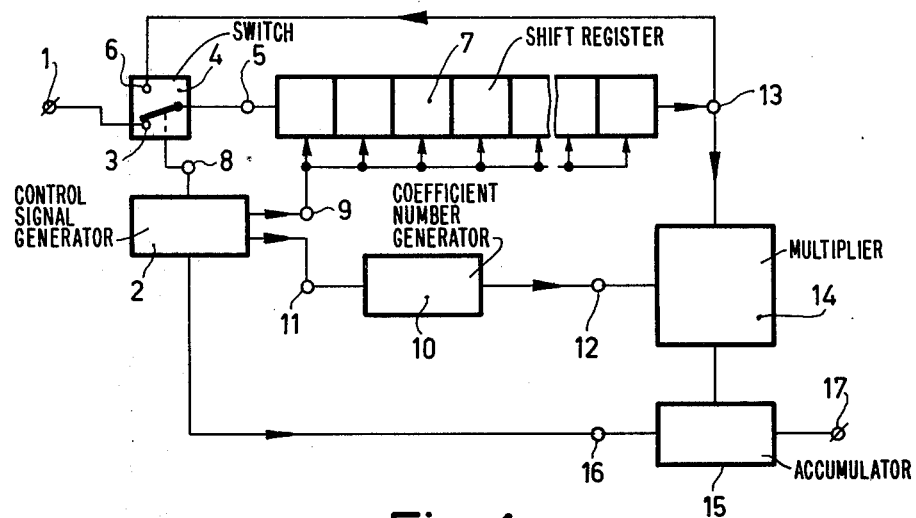

United States Patent [19]

Eggermont

[11] 4,136,398
[45] Jan. 23, 1979

[54] DIGITAL FILTER HAVING COEFFICIENT NUMBER GENERATOR

[75] Inventor: Ludwig D. J. Eggermont, Eindhoven, Netherlands

[73] Assignee: U.S. Philips Corporation, New York, N.Y.

[21] Appl. No.: 688,535

[22] Filed: May 21, 1976

[30] Foreign Application Priority Data

May 26, 1975 [NL] Netherlands ............ 7506141

[51] Int. Cl.² ............................................. G06F 15/34
[52] U.S. Cl. ..................................... 364/724; 328/167; 364/718
[58] Field of Search ............... 235/152, 156; 328/167; 325/38 B; 364/718, 724

[56] References Cited

U.S. PATENT DOCUMENTS

| | | | |
|---|---|---|---|
| 3,639,848 | 2/1972 | Elliott | 328/167 |
| 3,777,130 | 12/1973 | Croisier et al. | 235/152 |
| 3,814,917 | 6/1974 | Nussbaumer | 235/152 |
| 3,822,404 | 7/1974 | Croisier et al. | 325/38 B |
| 3,930,147 | 12/1975 | Bellanger et al. | 235/156 |
| 3,959,637 | 5/1976 | Nussbaumer | 235/152 |
| 3,963,911 | 6/1976 | Franks | 235/156 |
| 3,968,354 | 7/1976 | Ferrieu | 235/152 |
| 4,002,981 | 1/1977 | Eggermont | 325/38 B X |
| 4,024,385 | 5/1977 | Richards | 235/152 |

Primary Examiner—David H. Malzahn
Attorney, Agent, or Firm—Thomas A. Briody; Steven R. Biren

[57] ABSTRACT

A digital filter for generating digital output signals from information signals in accordance with a predetermined transfer characteristics includes a coefficient number generator for supplying digital numbers which indicate the values of coefficients which represent the transfer characteristic. The coefficient number generator includes a device for storing increments of successive coefficient values in numerical form and a decoder connected thereto for recovering the coefficient numbers from the numbers stored in the storage device.

3 Claims, 5 Drawing Figures

DIGITAL FILTER HAVING COEFFICIENT NUMBER GENERATOR

The invention relates to a digital filter for generating digital output signals from information signals in accordance with a pre-determined transfer characteristic, comprising at least one coefficient number generator for supplying numbers which indicate the values of coefficients which represent the transfer characteristic.

Such a digital filter is disclosed in, for example, U.S. Pat. No. 3,639,848 which describes an arrangement in which the coefficient number generator is constructed as a storage device in which the values of the coefficients which characterize the pulse response curve of the filter are formed in the shape of numbers. However, this requires a storage device having a large storage capacity so that, for example, an accurate recording of each of these numbers requires a twelve-bit word per number.

It is an object of the invention to provide an improved digital filter of the type described in the opening paragraph above.

According to the invention, a digital filter of the type described is characterized in that the coefficient value number generator comprises a storage device which is arranged to store increments of successive coefficient values in numerical form, with a decoder connected thereto for recovering the coefficient numbers from the numbers stored in the storage device. Herewith an increment may have been derived from the difference between two successive coefficients as well as from a differential coding of the pulse response.

Embodiments of the invention will now be described with reference to the accompanying diagrammatic drawings in which:

FIG. 1 is a block diagram of a digital filter and

FIGS. 2 to 5 inclusive are block diagrams of digital coefficient number generators for use in a digital filter such as that illustrated in FIG. 1.

In these Figures corresponding parts are designated by the same reference numerals.

FIG. 1 shows a digital filter embodying the invention. This filter is provided with an input terminal 1 to which, controlled by a control signal generator 2, digital input signals are periodically supplied, in a manner not shown, in the form of numbers: as will be described hereinafter, in accordance with a pre-determined transfer characteristic the filter determines from them digital output signals.

The signal generator 2 generates, in known manner, the control signal required for the operation of the filter so as to control the signal processing to be performed.

The input terminal 1 is coupled through a first contact 3 of a change-over switch 4 to a signal input terminal 5 of a delay device, which in this case is a feedback shift register 7, through contact 6 of changeover switch 4. An output of the control signal generator 2 is connected to a control input 8 of the changeover switch 4 and another output is connected to a shift pulse input 9 of the shift register 7. Just prior to the reception of an input signal the control signal generator 2 adjusts the change-over switch 4 to the position as shown in the drawing, so that the input signal is passed to input terminal 5. At the same time the control signal generator 2 delivers a shift pulse to the shift pulse input 9 under the control of which the information stored in the shift register 7 is shifted one section which causes the information of the last section to be lost and the input signal appearing at input terminal 5 in the form of a number to be written into the first section of the register.

Another output of the signal generator 2 is connected to a control input 11 of a digital coefficient number generator 10 to which in response to the control signals supplies a sequence of numbers which indicate the values of the coefficients which represent the pulse response curve of the filter.

To realize the digital filter process a multiplier 14 and an accumulator 15 connected thereto are connected to the output 13 of the shift register 7 and to the output 12 of the coefficient generator 10. The accumulator 15 is also controlled through a control input 16 by the control signal generator 2.

Between two successively received input signals the control signal generator 2 changes the switch 4 to its other position, not shown in the drawing, and thereupon supplies a number of shift pulses, equal to the number of sections of the shift register 7, via the shift pulse input 9 and also supplies a number of control pulses to the control pulse input 11.

In response to these shift pulses the contents of the shift register 7 are circulated once, whilst the numbers stored in the sections are successively supplied to the multiplier 14. In response to the control signals the coefficient number generator 10 supplies, successively and synchronously with the numbers supplied by the shift register, the digital coefficient numbers to the multiplier 14. For each successive section read out of the register, the multiplier 14 thus forms the product of the number in that section and a digital coefficient and supplies the product to the accumulator 15. The latter accumulates the products and delivers them, controlled by the control signal supplied to the control input 16, to the output terminal 17 of the filter whereafter the accumulator is reset.

Figure 2:
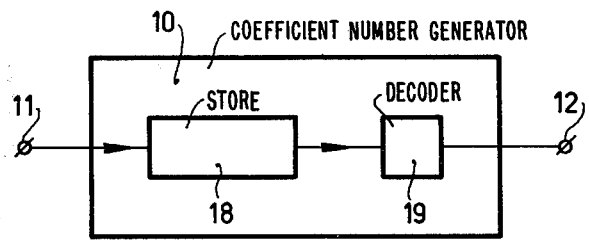

As shown in FIG. 2, the coefficient generator 10 comprises a store 18 which is operative to store increments of successive coefficient values in numerical form, and which feeds a decoder 19.

Figure 3:
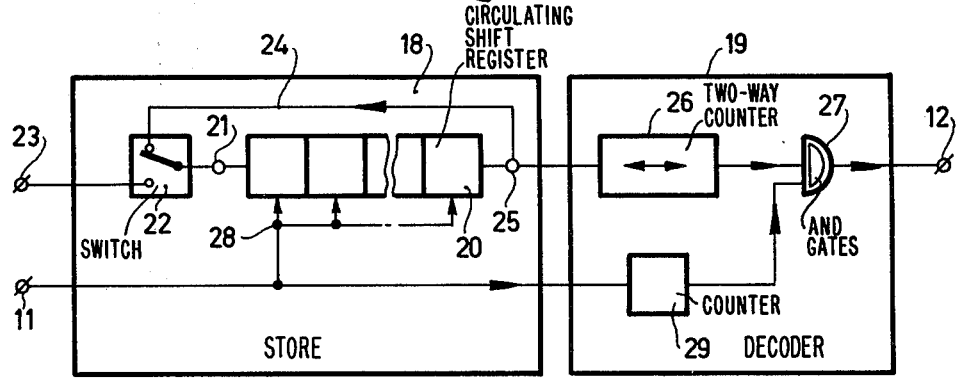

FIG. 3 shows in greater detail an embodiment of a coefficient number generator comprising a store 18 and a decoder 19. The bit pattern which is stored in the store 18 and which represents the increments of successive coefficient values is equal to the pattern which would be supplied by a linear delta-modulator encoder having an ideal integrator in its feedback loop if the desired pulse response of the filter were applied as input signal to such a modulator. To that end the storage device 18 is constructed as a circulating shift register 20 whose input 21 can be connected through a change-over switch 22 either through a feedback loop 24 to its output 25, or, to a signal input 23 for entering the uniform delta-modulated pulse response into the shift register.

The decoder 19 connected to the output 25 of the shift register comprises a simple two-way counter 26. Logical "AND" gate circuits 27 are connected to the outputs of this counter for reading the contents of the counter at given moments. To control the complete coefficient generator 10 the control input 11 is connected to a shift pulse input 28 of the shift register 20 and also through a counter 29 to the logical "AND"-gate circuits 27. The counter 29 has a maximum counting position which is equal to the coefficient of the bit rate of the delta-modulated pulse response curve and the rate of occurrence of the desired coefficient numbers whilst the bit rate of the delta pulses is equal to the rate of the control signal pulses supplied to the control input 11.

The operation is as follows. The two-way counter 26 is reset by the control signal generator 2 in a manner not shown. With the switch 22 in the position illustrated in FIG. 3, control pulses are supplied to input 11 to circulate the contents of the shift register 20. One-bit words, which represent the delta-modulated pulse response curve, are then supplied by the shift register 20 to the two-way counter 26 and are accumulated in this counter.

The control pulses supplied to the counter 29 increase the count of this counter until the maximum count has been obtained. The counter 29 is then reset and at the same time applies a release pulse to the "AND" gate circuits 27 which thereupon delivers to output terminal 12 the actual counting position of the two-way counter 26: at the same time, the contents of the counter 26 are preserved.

If desired, the filter can so be arranged that the shift pulses supplied to the shift pulse input 9 are used for the release pulses supplied to the "AND" gate circuit 27; the counter 29 then can be dispensed with.

A filter as shown in FIG. 3 is suitable for use as an interpolating filter. In that case the frequency of the release pulses supplied to the "AND"-gate circuit 27 must be increased by a multiple, the contents of the shift register 7 must be circulated between two successively received input signals for a number of times which has been increased by said multiple whilst, after each circulation of the total amount of generated coefficient numbers the coefficient number series is used which is shifted over one output period and the frequencies of the control signals supplied to the accumulator 15 are correspondingly increased. If the repetition frequency of the filter characteristic exceeds its cut-off frequency by more than a factor of 8 a gain in storage room can be obtained with respect to the storage room required for some known filters.

Figure 4:
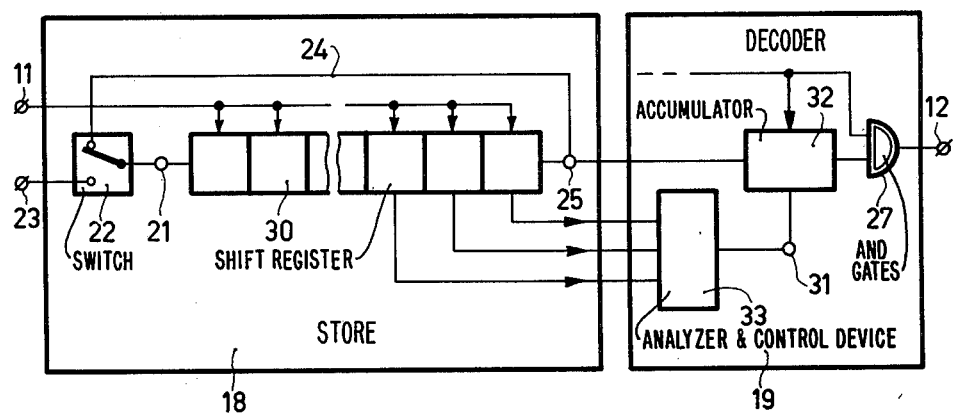

Another embodiment is shown in FIG. 4. The bit pattern stored in the storage device 18, which represents the increments of successive coefficient values, is then equal to the pattern generated by a nonlinear delta-modulation encoder when the desired pulses response curve of the filter is supplied to this modulator as an input signal; such nonlinear delta modulator encoders are e.g. digitally-controlled delta-modulation encoders (DCDM) or high information delta-modulation encoders (HIDM). DCDM is described in U.S. Pat. No. 1,261,951 and HIDM is described in the book "Modulation, Noise and Spectral Anaylses" by Paxter, McGraw-Hill, 1965, pages 694–695 in particular.

By means of such methods, variation of the step-size to the changes in the signal values of the response curves is realized during modulation so that a considerably smaller number of bits may suffice than is possible with linear delta modulation for the same dynamic range. The number of sections of the shift register 30 in FIG. 4 is therefore correspondingly smaller than the number of sections of shift register 20 in FIG. 3.

The decoder 19 in FIG. 4 comprises an accumulator 32 having a signal-input terminal and a control input terminal, the signal input terminal being connected to the output 25 of the shift register 30. Further it comprises a pattern analyzer and step-size control device 33 connected to the last three sections of the shift register. The output of device 33 is connected to the terminal 31. A detailed embodiment of a pattern analyser and step-size control device 33, which is suitable for DCDM and which also comprises the three last sections of the shift register 30 is described in British Application No. 2112/75 which corresponds to U.S. Pat. No. 4,002,981.

The number generator shown in FIG. 4 operates as follows. By means of a logic circuit, not shown, the step-size analyser and control device 33 analyses in a known manner the three last DM-bits in the shift register 30. To this end this circuit is arranged in such a way that when the information in the three last sections is the same a logic signal is supplied to the step-size control device depending on the value of that information. These logic signals control, in a known manner, a number generator in the step size control device; the value of a number is determined by the value of the number preceding it and the logic signal supplied to it. Through input 31 these numbers are supplied to the accumulator 32, where, controlled by the signal value supplied by the shift register 30 these numbers are accumulated in the accumulator after the accumulator has been reset by a control signal from the control signal generator 2. The series of numbers obtained in this manner is supplied to the output terminal 12 in a corresponding manner to the series of numbers supplied by the two-way counter 26 shown in FIG. 3.

With a decoder 19 arranged for HIDM the pattern analyser and step-size control device 33, shown in FIG. 4, is arranged in a known manner in such a way that the value of the number supplied to the accumulator 32 is doubled after detection of the same information in the three last sections of the shift register 30; the value is halved if the information in the last section is the inverse of that in the last section but one of the shift register, and the value remains unchanged in all other cases. The structure and the operation of the accumulator and the "AND" gate circuits are the same as for DCDM signals.

The accuracy with which the coefficient numbers approximate the instantaneous values of the pulse response curve is further improved by optimizing the DM, DCDM or HIDM bit pattern stored in the storage device 18. As the pulse response curve is a pre-known signal, the next following signal value can always be taken into account when coding a given signal value. The bit pattern obtained in this way may deviate from the pattern which is produced by a DM, DCDM or HIDM coder if the response curve is supplied to it as input signal. This means that a DM, DCDM or HIDM decoder generates the desired coefficient number as accurately as possible from the bit pattern stored in the storage device 18.

Figure 5:
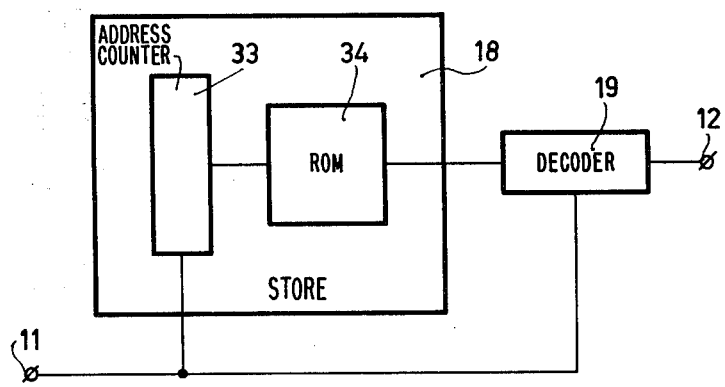

FIG. 5 shows an embodiment of a coefficient number generator in which the bit pattern which represents the increments of successive coefficient values is arranged in words. The storage device 18 is arranged in such a way that these coefficient numbers or the difference values of every two successive coefficient numbers have been stored as words in pulse code modulated (PCM) form or the numbers associated with a differential pulse code modulated (DPCM) pulse response curve have been stored as words. To that end the storage device 18 comprises a read only memory (ROM) 34 with an address counter 33 connected for control of the ROM.

Control pulses are supplied by the control generator 2, between two successively received input signals, at the control input 11 and cause the address counter 33 to supply successive addresses to the ROM. In response, the PCM coded difference signal values or the values of the DPCM coded pulse response curve are supplied consecutively and in numerical form by the ROM to an accumulator in the decoder 19. The accumulator adds each newly received number to the sum of all previously received numbers and presents each sum obtained in this manner to the output terminal 12.

With non-recursive digital filters with a high repetition frequency the number values of successive coefficient values are not far apart. This means that successive coefficient numbers differ only slightly from one another and that the small differences can be coded with comparatively few bits per word. With respect to known filters for which the value of each coefficient value is stored in its entirety in coded form in a storage device it is possible to achieve a considerable saving in storage room.

With a symmetrical pulse response of the filter, a further saving of storage room by a factor of two can be effected by adding together numbers which were symmetrically stored in the storage device 7 before supplying them to the multiplier 14 because it is of no importance as far as the accumulator 15 of FIG. 1 is concerned in which sequence the product of the digital coefficient numbers and the numbers stored in the shift register 7 are supplied.

The digital input signals may be stored in the shift register 7 in any suitable form.

What is claimed is:

1. A digital filter for generating digital output signals from information signals in accordance with a predetermined transfer characteristic and having at least one coefficient number generator means for supplying digital numbers which indicate the values of coefficients which represent the transfer characteristic, said coefficient number generator means comprising storage means for storing increments of successive coefficient values in numerical form and decoder means connected thereto for recovering the coefficient numbers from the numbers stored in the storage means, said storage means comprising a circulating shift register having a signal input, a shift pulse input for receiving a control signal and an output, and switching means having first and second switching positions and connected to said signal input for providing an input signal which comprises the successive coefficient values corresponding to a response curve in uniform delta modulated form when in said first position and for connecting the shift register output to its signal input in said second position, said decoder means comprising a two-way counter having an input connected to the output of said circulating shift register and an output, a second counter having an input for receiving said control signal and an output, and AND-gate circuit means having inputs for receiving the two-way counter and second counter outputs and an output for providing a decoder output which is representative of the count of said two-way counter.

2. A digital filter for generating digital output signals from information signals in accordance with a predetermined transfer characteristic and having at least one coefficient number generator means for supplying digital numbers which indicate the values of coefficients which represent the transfer characteristic, said coefficient number generator means comprising storage means for storing increments of successive coefficient values in numerical form and decoder means connected thereto for recovering the coefficient numbers from the numbers stored in the storage means, said storage means comprising a shift register having a signal input, a shift pulse input for receiving a control signal and an output, and switching means having first and second switching positions and connected to said signal input for providing an input signal which comprises the successive coefficient values corresponding to a response curve in compressed delta modulated form when in said first position and for connecting the shift register output to its signal input in said second positon, said decoder means comprising pattern analyzer and step-size control means having three inputs connected respectively to the last three sections of said shift register and an output, an accumulator having a first input connected to the output of said shift register, a second input connected to the output of said pattern analyzer and step-size control means, a control input for receiving said control signal and an output, and AND-gate circuit means having inputs for receiving said accumulator output and said control signal and an output for providing a decoder output which is representative of the signal accumulated in said accumulator.

3. A digital filter for generating digital output signals from information signals in accordance with a predetermined transfer characteristic and having at least one coefficient number generator means for supplying digital numbers which indicate the values of coefficients which represent the transfer characteristic, said coefficient number generator means comprising storage means for storing increments of successive coefficient values in numerical form and decoder means connected thereto for recovering the coefficient numbers from the numbers stored in the storage means, said storage means comprising an address counter for storing coefficient values as words in pulse code modulated form and having an input for receiving a control signal and an output, and a read-only memory having an input connected to the output of said address counter and an output, said decoder means comprising an accumulator having an input for receiving said read-only memory output, and said decoder means further comprising an input terminal for receiving said control signal and an output terminal for providing a decoder output which is representative of the signal accumulated in said accumulator.

* * * * *